US012660691B2

(12) United States Patent
Pachamuthu et al.

(10) Patent No.: US 12,660,691 B2
(45) Date of Patent: Jun. 16, 2026

(54) HIGH DENSITY SEMICONDUCTOR DEVICE INCLUDING INTEGRATED CONTROLLER, LOGIC CIRCUIT AND MEMORY DIES

(71) Applicant: Sandisk Technologies, Inc., Milpitas, CA (US)

(72) Inventors: Jayavel Pachamuthu, San Jose, CA (US); Srinivasan Sivaram, Los Gatos, CA (US); Masaaki Higashitani, Cupertino, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 845 days.

(21) Appl. No.: 17/949,069

(22) Filed: Sep. 20, 2022

(65) Prior Publication Data

US 2024/0096850 A1 Mar. 21, 2024

(51) Int. Cl.
| | |
|---|---|
| *H10W 90/00* | (2026.01) |
| *H10W 72/00* | (2026.01) |
| *H10W 72/90* | (2026.01) |

(52) U.S. Cl.
CPC ...... *H10W 90/00* (2026.01); *H10W 72/07554* (2026.01); *H10W 72/90* (2026.01); *H10W 72/923* (2026.01); *H10W 72/9415* (2026.01); *H10W 72/942* (2026.01); *H10W 72/944* (2026.01); *H10W 72/952* (2026.01); *H10W 90/724* (2026.01); *H10W 90/752* (2026.01); *H10W 90/792* (2026.01)

(58) Field of Classification Search
None
See application file for complete search history.

(56) References Cited

U.S. PATENT DOCUMENTS

| | | | |
|---|---|---|---|
| 10,651,153 B2 | 5/2020 | Fastow et al. | |
| 11,094,674 B2 | 8/2021 | Vodrahalli et al. | |
| 11,276,669 B2 | 3/2022 | Yang et al. | |
| 2013/0049225 A1 | 2/2013 | Kang et al. | |
| 2016/0079164 A1 | 3/2016 | Fukuzumi et al. | |
| 2020/0168595 A1* | 5/2020 | Chang | H01L 23/481 |
| 2020/0328180 A1* | 10/2020 | Cheng | H01L 25/18 |

* cited by examiner

*Primary Examiner* — Hung K Vu

(74) *Attorney, Agent, or Firm* — Pearl Cohen Zedek Latzer Baratz LLP

(57) ABSTRACT

An integrated controller, logic circuit and memory array ("CLM") semiconductor device includes stacked controller, memory array logic circuit and memory array wafers, or individual dies diced therefrom, which together operate as a single, integrated semiconductor flash memory device. The memory array logic circuit dies and/or the memory array dies may be formed with full-thickness plated or filled vias connecting to bond pads on opposed surfaces of the dies. The bond pads of the respective stacked semiconductor dies may be aligned and affixed to each other to electrically and mechanically couple each of the semiconductor dies in the respective wafers together.

20 Claims, 16 Drawing Sheets

```
┌─────────────────────────┐ ⌐ 50
│  Define MA Logic Circuits │
│    on the First Wafer     │
└─────────────────────────┘
            │
            ▼
┌─────────────────────────┐ ⌐ 52
│      Form Metal          │
│  Interconnects and Vias  │
└─────────────────────────┘
            │
            ▼
┌─────────────────────────┐ ⌐ 54
│      Form Bond Pads      │
└─────────────────────────┘
```

*(Line 4-4)*

*(Line 8-8)*

*Fig. 9*

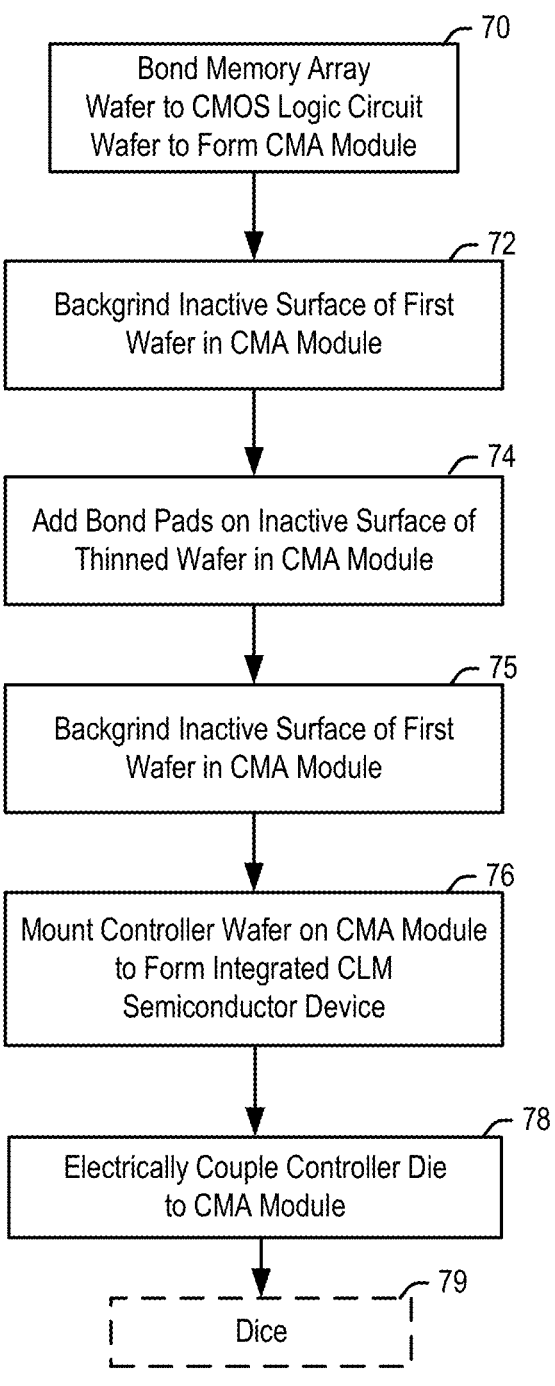

Bond Memory Array
Wafer to CMOS Logic Circuit
Wafer to Form CMA Module — 70

Backgrind Inactive Surface of First
Wafer in CMA Module — 72

Add Bond Pads on Inactive Surface of
Thinned Wafer in CMA Module — 74

Backgrind Inactive Surface of First
Wafer in CMA Module — 75

Mount Controller Wafer on CMA Module
to Form Integrated CLM
Semiconductor Device — 76

Electrically Couple Controller Die
to CMA Module — 78

Dice — 79

*Fig. 16*
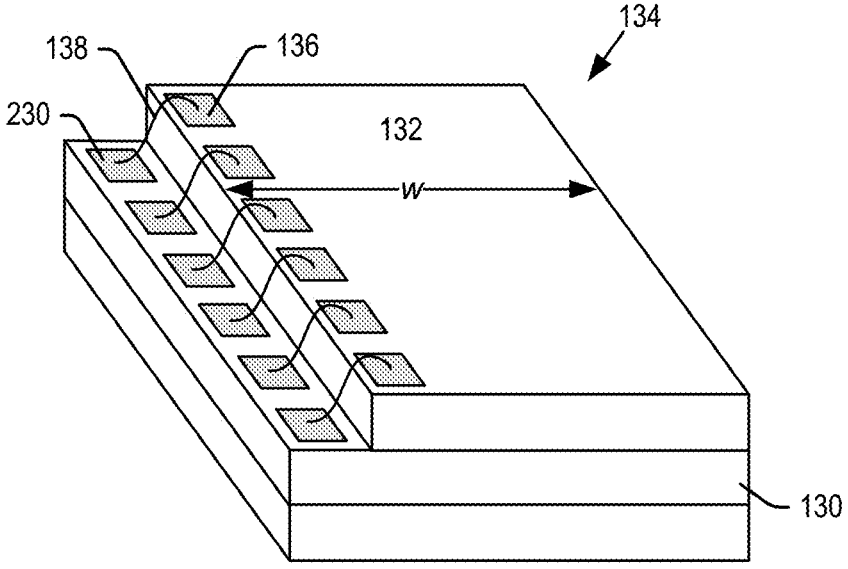
*Fig. 17*
*Fig. 18*
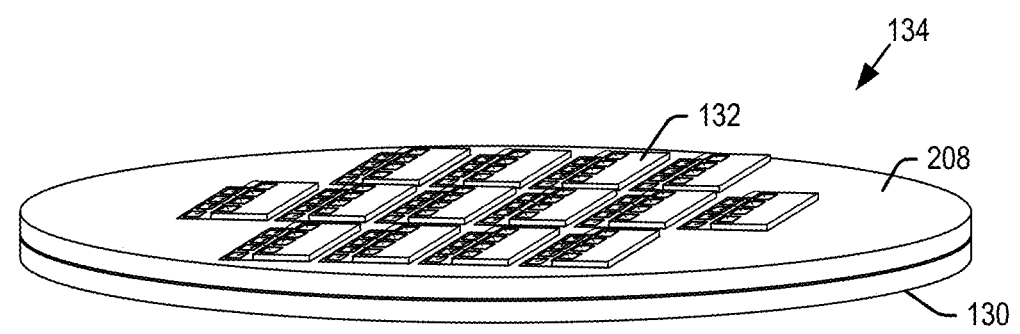

HIGH DENSITY SEMICONDUCTOR DEVICE INCLUDING INTEGRATED CONTROLLER, LOGIC CIRCUIT AND MEMORY DIES

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives.

Recently, ultra-high density memory devices have been proposed using a 3D stacked memory structure having strings of memory cells formed into layers. One such storage device is sometimes referred to as a Bit Cost Scalable (BiCS) architecture. In addition to the layered memory cells, 3D memory devices include a logic circuit for controlling read/write to the memory cells. The logic circuit, often fabricated using complementary metal-oxide-semiconductor (CMOS) technology, may typically be formed beneath stacked memory layers within a semiconductor wafer. Given current memory array size constraints and excess heating of the CMOS circuitry during fabrication, it is now known to fabricate memory arrays and CMOS circuitry on separate wafers, with dies from these wafers being affixed to each other after fabrication.

The joined memory/CMOS circuitry dies may in turn be incorporated into a semiconductor package by mounting them on a substrate. The substrate may further include a controller, such as an ASIC, that controls the exchange of data and signals between the semiconductor package and a host device. The number of memory layers in the memory array of these semiconductor packages continues to grow to meet ever increasing memory demands. However, this increased storage capacity in conventional semiconductor packages has come with a tradeoff in system performance, read/write latency and parasitic capacitance.

DESCRIPTION OF THE DRAWINGS

FIG. 9 is a flowchart for forming an integrated controller, logic circuit and memory array semiconductor device according to embodiments of the present technology.

FIG. 16 is a perspective view of an integrated controller, logic circuit and memory array semiconductor device including a controller die physically and electrically bonded to a CMOS logic circuit and memory array module according to embodiments of the present technology.

FIG. 17 is a cross-sectional view of an integrated controller, logic circuit and memory array semiconductor device according to embodiments of the present technology.

FIG. 18 is a perspective view of an integrated controller, logic circuit and memory array semiconductor device comprised of controller dies mounted on a pair of bonded CMOS and memory array wafers according to embodiments of the present technology.

DETAILED DESCRIPTION

Figures 1, 2:
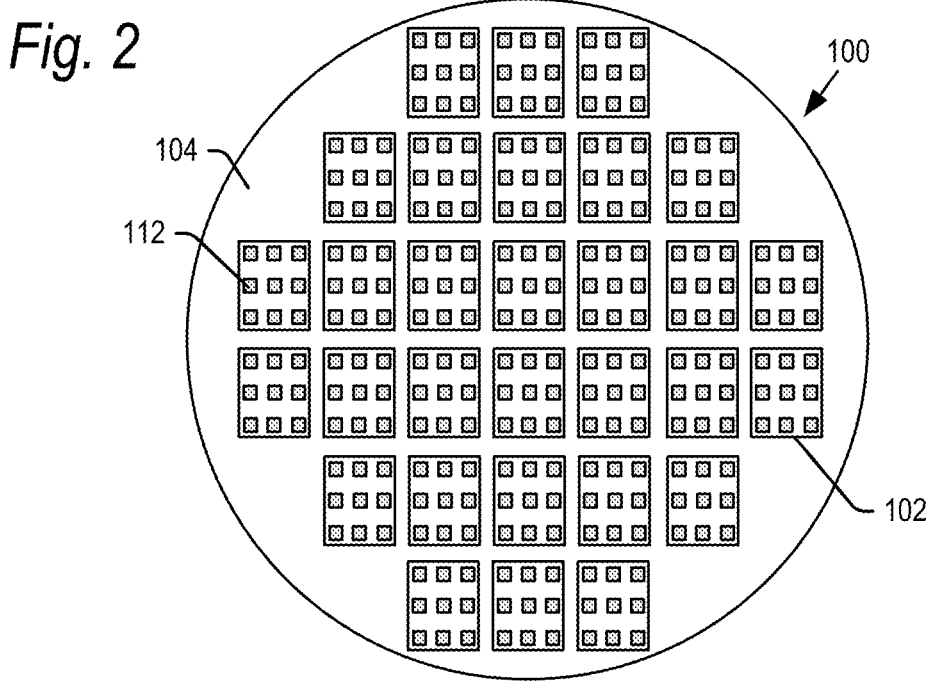
FIG. 1 is a flowchart for forming a first semiconductor wafer including memory array logic circuit dies according to embodiments of the present technology.
FIG. 2 is a top view of a first major surface of a first semiconductor wafer including memory array logic circuit dies according to embodiments of the present technology.

The present technology will now be described with reference to the figures, which, in embodiments, relate to an integrated controller, logic circuit and memory array ("CLM") semiconductor device. The CLM semiconductor device may include a stacked controller, memory array logic circuit and memory array wafers, or individual dies diced therefrom, which together operate as a single, integrated semiconductor flash memory device. The semiconductor dies of the memory array wafer may be formed as a 2D memory structure or 3D stacked memory structure having strings of memory cells formed into layers. The semiconductor dies of the memory array logic circuit wafer include sensor amplifier and peripheral functions, and act as an interface with the memory arrays of the memory array dies. The semiconductor dies of the controller wafer perform memory management and act as an interface with a host device such as a server or a host within an enterprise datacenter.

The memory array logic circuit dies and/or the memory array dies may be formed with full-thickness plated or filled vias connecting to bond pads on opposed surfaces of the dies. Thus, once the logic circuit and memory array wafers are stacked, the bond pads of the respective stacked semiconductor dies may be aligned and affixed to each other to electrically and mechanically couple each of the semiconductor dies in the respective wafers together. Further details of the integrated CLM semiconductor device according to various embodiments of the present technology are provided below.

It is understood that the present technology may be embodied in many different forms and should not be construed as being limited to the embodiments set forth herein. Rather, these embodiments are provided so that this disclosure will be thorough and complete and will fully convey the technology to those skilled in the art. Indeed, the technology is intended to cover alternatives, modifications and equivalents of these embodiments, which are included within the scope and spirit of the invention as defined by the appended claims. Furthermore, in the following detailed description of the present technology, numerous specific details are set forth in order to provide a thorough understanding of the present technology. However, it will be clear to those of ordinary skill in the art that the present technology may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is 0.15 mm or alternatively ±2.5% of a given dimension.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

Figure 3:
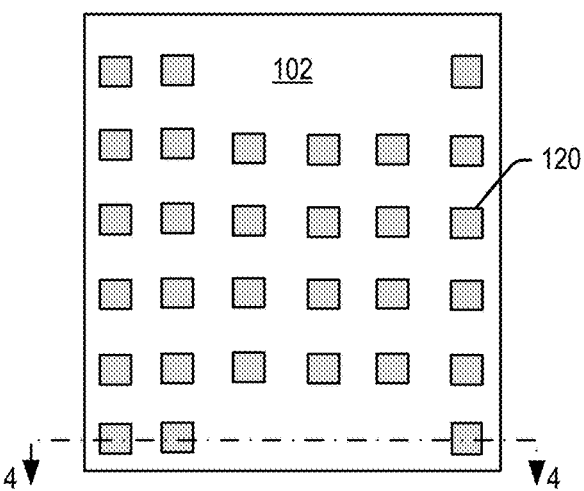
FIG. 3 is a top view of a memory array logic circuit die of the first semiconductor wafer according to embodiments of the present technology.
Figure 4:
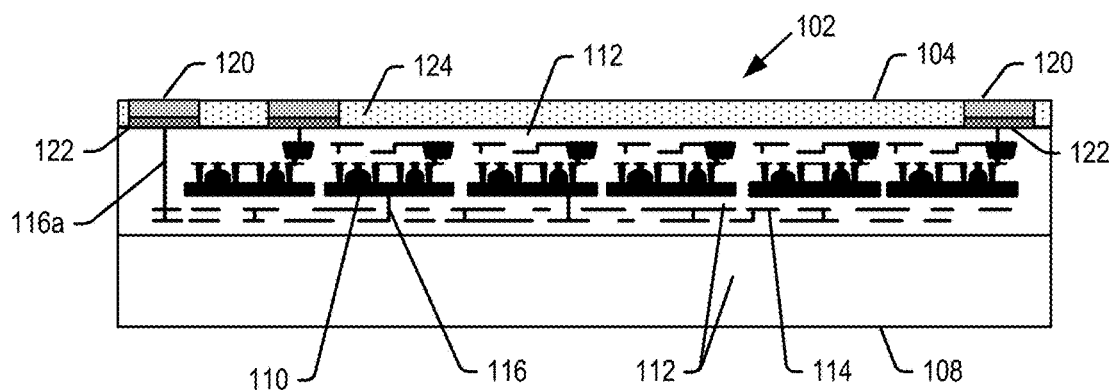
FIG. 4 is a cross-sectional edge view of a memory array logic circuit die of the first semiconductor wafer through line 4-4 of FIG. 3 according to embodiments of the present technology.

An embodiment of a first wafer including memory array logic circuit semiconductor dies will now be explained with reference to the flowchart of FIG. 1, and the views of FIGS. 2-4. In step 50, a first semiconductor wafer 100 may be processed into a number of first semiconductor dies 102. These first semiconductor dies 102 may also be referred to herein as logic circuit semiconductor dies 102, and the first wafer 100 may also be referred to herein as a logic circuit semiconductor wafer 100. The first semiconductor wafer 100 may start as an ingot of wafer material which may be monocrystalline silicon grown according to either a Czochralski (CZ) or floating zone (FZ) process. However, first wafer 100 may be formed of other materials and by other processes in further embodiments.

The logic circuit semiconductor wafer 100 may be cut from the ingot and polished on both the first major planar surface 104, and second major planar surface 108 (FIG. 4) opposite surface 104, to provide smooth surfaces. The first major surface 104 may undergo various processing steps to divide the wafer 100 into the respective first semiconductor dies 102 (one of which is numbered in FIG. 2), and to form integrated circuits of the respective first semiconductor dies 102 on and/or in the first major surface 104. The pattern of semiconductor dies 102 are shown by way of example only and there may be a wide variety of other patterns, including more or less dies, in further embodiments.

The various processing steps for forming integrated circuits in the semiconductor dies 102 may include photolithographic steps, etching steps and metallization steps depositing metal layers, vias and contacts for transferring signals to and from the integrated circuits. FIGS. 3 and 4 illustrate a top view and a cross-sectional view of a single semiconductor die 102 representative of all dies 102 on the first wafer 100. The integrated circuits of semiconductor die 102 may comprise memory array logic circuits 110 formed in dielectric substrate layers 112. The memory array logic circuits 110 may be fabricated using CMOS technology, including various CMOS process steps such as for example deposition, patterning and doping of metals, metal oxides and silicon.

In step 52, multiple layers of metal interconnects 114 and vias 116 may be formed in and through the dielectric substrate layers 112 of the semiconductor die 102, electrically coupled to the CMOS logic circuits 110. In step 54, an upper layer of the metal interconnects 114 may be formed as die bond pads 120 (FIGS. 2-4) over a liner 122 in the first major surface 104. The bond pads 120 are used to couple the semiconductor dies 102 to semiconductor dies from other wafers as explained below. The pattern of bond pads 120 in FIGS. 3 and 4 are shown by way of example only and may have a wide variety of other patterns, including more or less bond pads, in further embodiments. The metal interconnects 114, including bond pads 120, may be formed for example of copper, aluminum and alloys thereof. The liner 122 may be formed for example of a titanium/titanium nitride stack such as for example Ti/TiN/Ti. The materials for the metal interconnects and liner may vary in further embodiments.

As is known in the art, the metal interconnects 114, vias 116 and dielectric substrate layers 112 may be formed for example by damascene processes one layer at a time using photolithography and thin-film deposition. These metal interconnects 114 and vias 116 may electrically couple the memory array logic circuits 110 to the die bond pads 120. The vias 116 may further include a pattern of full-thickness vias 116a extending between the top and bottom major planar surfaces 104, 108 of the first wafer 100.

The vias 116, including full-thickness vias 116a, may be formed by etching holes through the first semiconductor dies 102 and then plating or filling the holes with a conductive material. The conductive material may comprise copper, although other suitable materials such as aluminum, tin, nickel, gold, doped polysilicon, and alloys or combinations thereof may be used. A passivation layer 124 may be formed on top of the dielectric substrate layers 112. The bond pads 120 may be formed in the passivation layer 124, coupled to the vias 116. A group of one or more of the bonds pads 120 are also coupled to the full-thickness vias 116a.

Further detail of the CMOS memory array logic circuits 110 (also referred to herein simply as logic circuits 110) are described below with reference to FIG. 25, but in general, the logic circuits 110 include sensor amplifier (SA) and peripheral (peri) circuits which function as toggle mode interface circuits in order to decode Bitline/Wordline to buffer and transfer data to and from the memory arrays (also explained below). The logic circuit semiconductor dies 102 may include other and/or additional integrated circuits in further embodiments.

Figure 5:
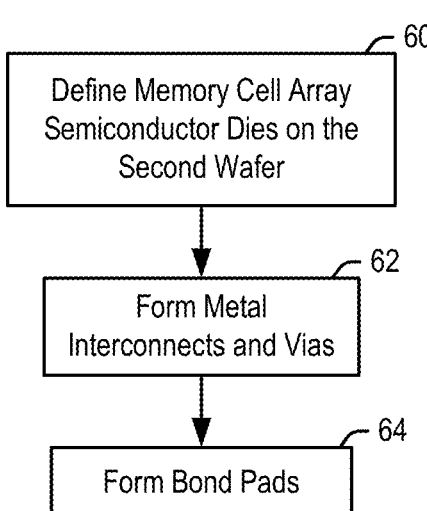
FIG. 5 is a flowchart for forming a second semiconductor wafer including memory array dies according to embodiments of the present technology.

Before, after or in parallel with the formation of the CMOS logic circuit semiconductor dies on first wafer 100, a second semiconductor wafer 200 may be processed into a number of second semiconductor dies 202. Fabrication and operation of the semiconductor dies 202 on wafer 200 will now be explained with reference to the flowchart of FIG. 5 and the views of FIGS. 6-8.

Figure 6:
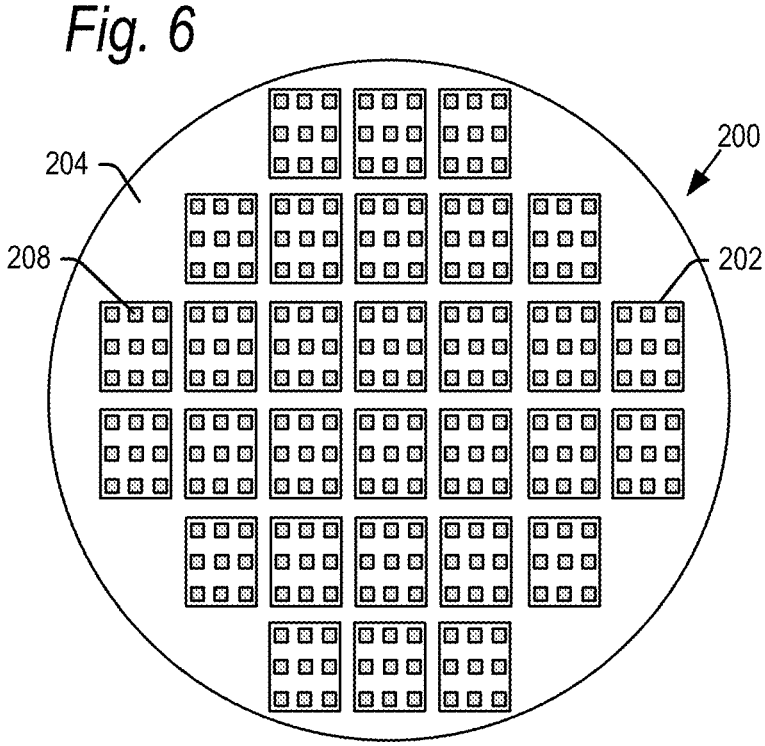
FIG. 6 is a top view of a first major surface of a second semiconductor wafer including memory array dies according to embodiments of the present technology.

FIG. 6 shows a top view of the second semiconductor wafer 200. The second semiconductor wafer 200 may start as an ingot of monocrystalline silicon grown according to either a CZ, FZ or other process. The second semiconductor wafer 200 may be cut and polished on both the first major surface 204, and second major surface 208 (FIG. 8) opposite surface 204, to provide smooth surfaces. The first major surface 204 may undergo various processing steps to divide the second wafer 200 into the respective second semiconductor dies 202, and to form integrated circuits of the respective second semiconductor dies 202 on and/or in the first major surface 204. These second semiconductor dies 202 may also be referred to herein as memory array dies 202, and the second wafer 200 may also be referred to herein as a memory array wafer 200. In embodiments, the size and configuration of second dies 202 on wafer 200 match the size and configuration of first dies 102 on wafer 100.

Figures 7, 8:
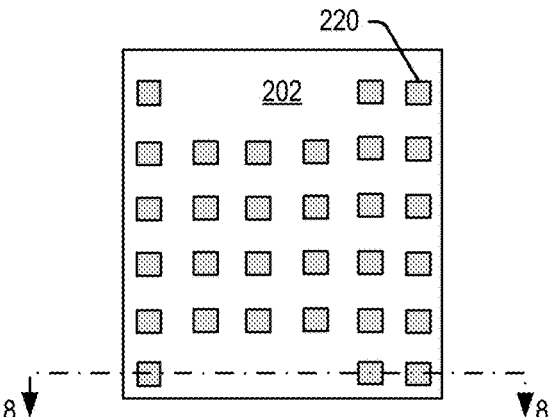
FIG. 7 is a top view of a memory array die of the second semiconductor wafer according to embodiments of the present technology.
FIG. 8 is a cross-sectional edge view of a memory array die of the second semiconductor wafer through line 8-8 of FIG. 7 according to embodiments of the present technology.

In one embodiment, the memory array dies 202 may be processed in step 60 to include a memory array 210 formed in a dielectric substrate including layers 212 as shown in FIG. 8. FIGS. 7 and 8 illustrate a top view and a cross-sectional view of a single die 202 representative of all dies 202 on wafer 200. The memory array may be formed by various processes including for example deposition, patterning and doping of metals, metal oxides and silicon.

In step 62, multiple layers of metal interconnects 214 and vias 216 may be formed in and through the dielectric substrate layers 212 of the semiconductor dies 202. In step 64, an upper layer of the metal interconnects 214 may be formed as die bond pads 220 (FIGS. 6-8) over a liner 222 in the first major surface 204. The bond pads 220 are used to couple the second semiconductor dies 202 to the first semiconductor dies 102 as explained below. The pattern of bond pads 220 are shown by way of example only and may have a wide variety of other patterns, including more or less bond pads, in further embodiments, with the provision that the positions of at least some of the bond pads 220 in dies 202 mirror the positions of the bond pads 120 in dies 102. The metal interconnects 214, including bond pads 220, may be formed of the same material and in the same way as the metal interconnects 114, though the positions of metal interconnects 214 in dies 202 may be different than the positions of metal interconnects 114 in dies 102.

The vias 216 may further include a pattern of full-thickness vias 216a extending between the top and bottom major planar surfaces 204, 208 of the second wafer 200. The vias 216, including full-thickness vias 216a, may be formed of the same material and in the same way as the vias 116, though the positions of vias 216 in dies 202 may be different than the positions of vias 116 in dies 102. A passivation layer 224 may be formed on top of the dielectric substrate layers 212. The bond pads 220 may be formed in the passivation layer 224, coupled to the vias 216. A group of one or more of the bonds pads 220 are also coupled to the full-thickness vias 216a. In embodiments, the full-thickness vias 116a, 216a may be omitted from one of the dies 102, 202.

Further details of the memory array 210 are provided below, but in general, the memory array 210 may be formed as a 2D structure, or a 3D stacked memory structure having strings of memory cells formed into layers. The array of memory cells is addressable by word lines via the row decoder and by bit lines via the column decoder from the memory array logic circuit dies 102. Multiple memory elements in memory array 210 may be configured so that they are connected in series or so that each element is individually accessible. By way of non-limiting example, flash memory systems in a NAND configuration (NAND memory) typically contain memory elements connected in series. A NAND string is an example of a set of series-connected transistors comprising memory cells and select gate transistors.

In embodiments, the memory cells may for example be configured for flash memory dies such as 2D NAND flash memory or 3D BiCS (Bit Cost Scaling), V-NAND or other 3D flash memory. However, it is understood that the second semiconductor dies 202 may be processed to include integrated circuits other than a 2D or 3D stacked memory structure.

Once the above-described fabrication of the first and second wafers 100, 200 is completed, the wafers 100 and 200 may be joined together and further processed as will now be described with reference to the flowchart of FIG. 9 and the views of FIGS. 10-15. In practice, after fabrication of the wafers 100 and 200 as described above, the wafers may be shipped to another fab for assembly as will be described with respect to FIG. 9. However, the further processing of wafers 100, 200 as described below may occur at the same fab where one or both wafers 100, 200 are fabricated.

Figure 10:
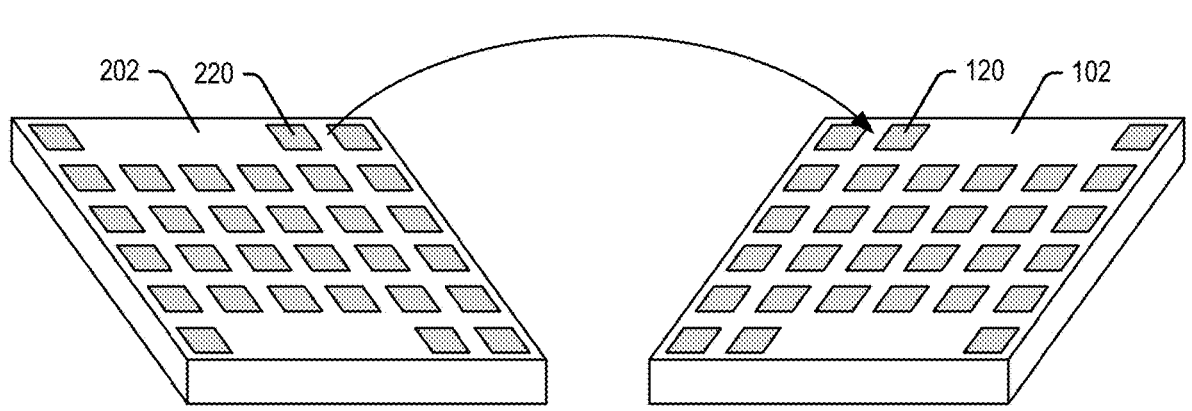
FIG. 10 is a perspective view of two dies from the logic circuit wafer and memory array wafer positioned to be bonded to each other according to embodiments of the present technology.
Figure 11:
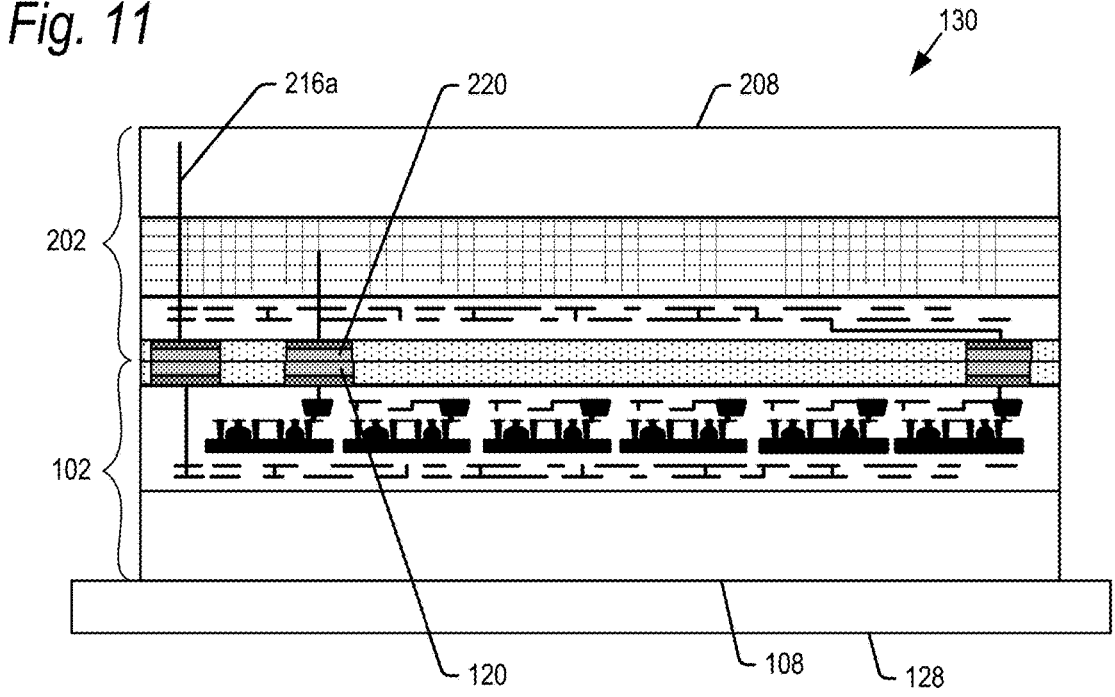
FIG. 11 is a cross-sectional view of a CMOS logic circuit and memory array module including dies from the logic circuit wafer and memory array wafer bonded to each other according to embodiments of the present technology.

Referring to step 70, with one of the wafers (e.g., the CMOS logic circuit wafer 100) supported on a carrier 128 (FIG. 11), the other wafer (wafer 200 in this example) may be flipped over and the wafers brought together so that the first major surfaces 104, 204 of each wafer face each other. As noted, the dies and bond pads on the respective dies are mapped during assembly so that, when the wafers 100, 200 are brought together, the dies and bond pads of respective wafers align with each other. FIG. 10 shows dies 102 and 202 from respective wafers 100 and 200 positioned for joining and FIG. 11 is a cross-sectional view showing a pair of dies 102, 202 joined together. FIG. 11 is representative and each of the dies 102 and bond pads 120 of wafer 100 may join with their corresponding dies 202 and bond pads 220 of wafer 200. As noted, the pattern of bond pads 120, 220 on dies 102, 202 is shown by way of example and may vary in further embodiments with the provision that the wafer maps be used when forming wafers 100 and 200 to ensure the dies and die bond pads of respective wafers 100, 200 align with each other when joined.

Once joined, the bond pads 120 may be physically and electrically coupled to bond pads 220. In one embodiment, the bond pads 120 and 220 may be directly bonded to each other, without solder or other added material, in a Cu-to-Cu bonding process. In a Cu-to-Cu bonding process, the bond pads 120, 220 are controlled to be highly planar and formed in a highly controlled environment largely devoid of ambient particulates that might otherwise settle on a bond pad 120 and/or 220 and prevent a close bond. Under such properly controlled conditions, the bond pads 120, 220 are aligned and pressed against each other to form a mutual bond based on surface tension and atomic attraction (Van der Waal) forces. Such bonds may be formed at room temperature, though heat may also be applied. Cu-to-Cu bonding is an example of fusion bonding. Other fusion bonding processes may be used, for example where the bond pads are formed of materials other than copper.

It is also understood that the respective dies 102, 202 from wafers 100, 200 may be bonded together by other means, such as for example hybrid bonding, where bonding occurs at the bond pads and at a film applied to the bonded surfaces of one or both wafers 100, 200. In further embodiments, the wafers 100, 200 may be bonded using gold bumps or solder bumps on the bond pads 120 and/or 220 that are heated and bonded together when the wafers are joined. The joined wafers 100, 200 may be referred to herein as a CMOS logic circuit and memory array module 130, or simply a CMA module 130.

Figure 12:
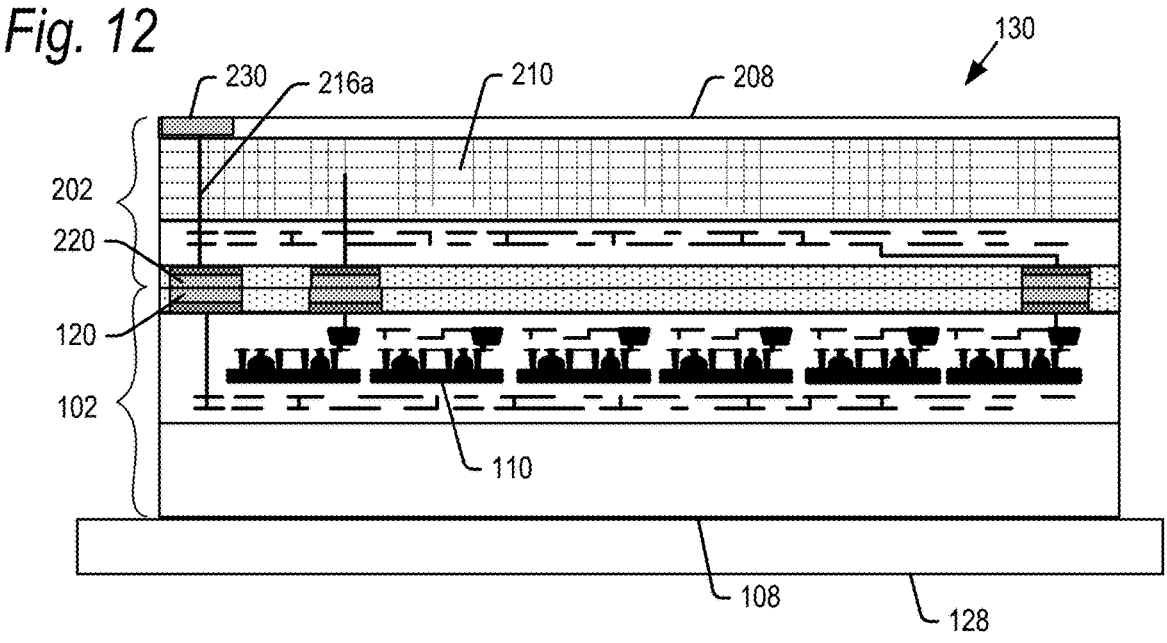
FIG. 12 is a cross-sectional view of the CMOS logic circuit and memory array module of FIG. 11 after thinning of the memory array die according to embodiments of the present technology.

In step 72, with the first wafer on the support surface, the second major surface 208 of the second wafer 200 of CMA 130 may be thinned in a backgrind process. The thinned second major surface 208 may also be referred to herein as the back surface of the wafer 200. The wafer 200 is thinned so that most or all of the dielectric substrate layers 212 above the memory array 210 is removed, and the full-thickness vias 216a are exposed at the second major surface 208. As shown in FIG. 12, in step 74, exterior bond pads 230 may be formed on the thinned second major surface 208 over the full-thickness vias 216a. The exterior bond pads 230 may be used to transfer signals between a controller die (explained below) and one or both of the dies 102, 202 of the CMA module 130. For example, signals may be transferred to/from the CMOS logic circuits 110 through a path including bond pads 120 and 220, the full-thickness vias 216a and exterior bond pads 230.

Figure 13:
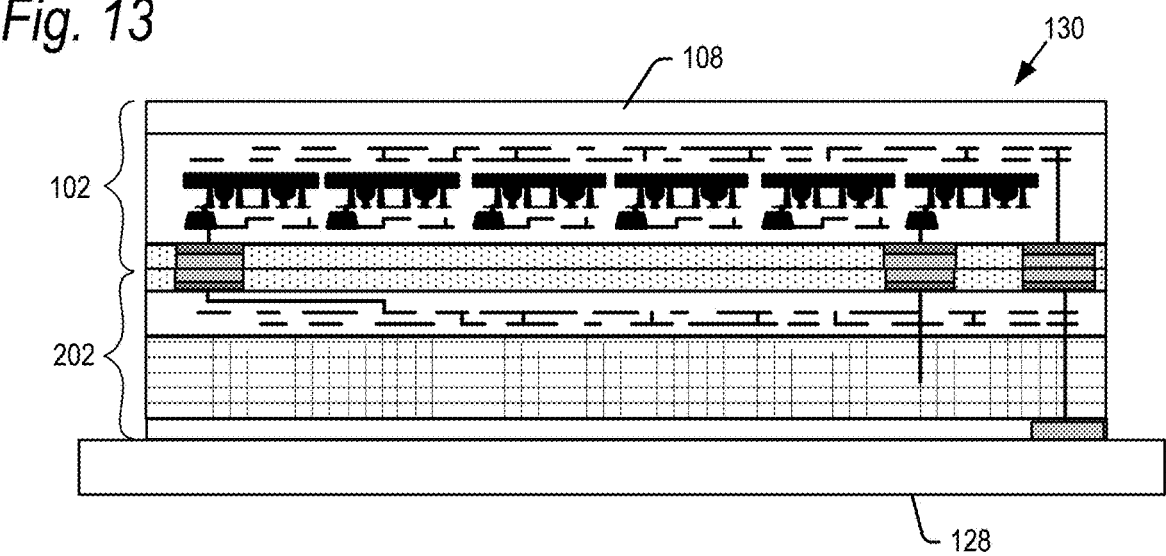
FIG. 13 is a cross-sectional view of the CMOS logic circuit and memory array module of FIG. 12 after thinning of the memory array logic circuit die according to embodiments of the present technology.
Figures 14, 15:
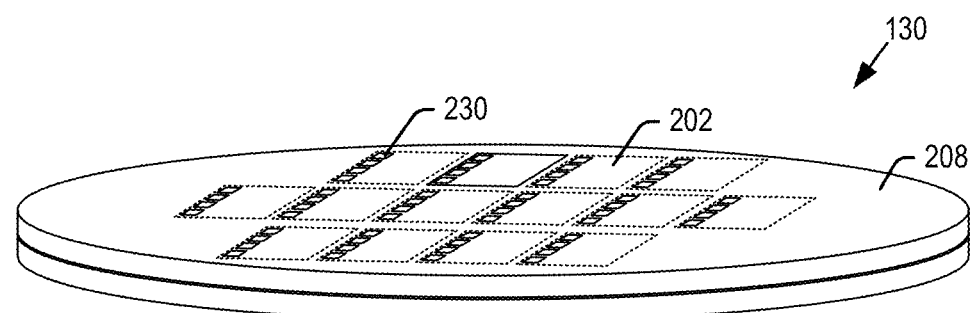
FIG. 14 is a perspective view of a CMOS logic circuit and memory array module comprised of a pair of semiconductor wafers according to embodiments of the present technology.
FIG. 15 is a perspective view of a CMOS logic circuit and memory array module comprised of a pair of semiconductor dies according to embodiments of the present technology.

In step 75, the CMA module 130 may be flipped over so that the back surface 208 of the second wafer 200 is supported on the carrier 128, and then the second major surface 108 of the first wafer 100 may be thinned in a backgrind process. The resulting finished CMA module 130 is shown in the cross-sectional view of FIG. 13. While FIG. 13 shows a single pair of dies 102, 202, at this point in the fabrication, the dies 102, 202 are still part of their respective wafers 100, 200. FIG. 14 is a perspective view of a CMA module 130 showing the bonded wafers 100, 200 comprising representative bonded pairs of dies 102, 202 (in phantom) and representative exterior bond pads 230 on the second major planar surface 208 of wafer 200. In further embodiments, the individual bonded die pairs may be diced from the CMA module 130 shown in FIG. 14. An example of such a bonded die pair is shown in the perspective view of FIG. 15. In embodiments, such a bonded die pair may also be referred to herein as a CMA module 130.

In the example embodiments described above, the full-thickness vias 216a and exterior bond pads 230 were fabricated within the second semiconductor dies 202 of wafer 200. However, it is understood that the full-thickness vias (116a) and exterior bond pads may be fabricated in the first semiconductor dies 102 of wafer 100 in addition to or instead of within the dies 202 of wafer 200.

In accordance with aspects of the present technology, one or more controller dies 132 (FIGS. 16 and 17) may be physically and electrically coupled to the CMA module 130 in step 76 to form a completed integrated controller, logic circuit and memory array (CLM) semiconductor device 134. The controller die 132 may be fabricated on a wafer 300 (FIGS. 28 and 29) to include integrated circuits, metal interconnects and vias as in the dies of wafers 100 and 200 (but in a different configuration). Further details of the controller die 132 are explained below with reference to FIG. 25, but in general, the controller die 132 may be an ASIC performing memory management for CMA module 130 which acts as an interface to control the exchange of data with a host device (e.g., host device 400, FIGS. 27 and 30).

In the embodiment shown in FIG. 16, the controller die 132 of CLM semiconductor device 134 may be formed with bond pads 136. In the embodiment of FIG. 16, the bond pads 136 may be formed along an edge of the controller die 132. The controller die 132 may have a smaller width, w, than that of the CMA module 130. In this way, the exterior bond pads 230 on the CMA module 130 are left exposed so that bond wires 138 may be formed electrically coupling like channels of controller bond pads 136 and the exterior bond pads 230 in step 78. A layer of DAF (die attach film) may be formed on the second major planar surface 208 of the CMA module 130 including the exterior bond pads to physically attach the controller die(s) 132 to the CMA module 130.

In one embodiment shown in the perspective view of FIG. 18, the CMA module 130 may be whole wafers 100, 200. In such embodiments, individual controller dies 132 may be physically and electrically coupled to each bonded die pair of the wafers 100, 200 in step 76. Thereafter, in one example, the wafers 100, 200 may be left intact, and the entire assembly may be used as a single CLM semiconductor device 134, comprised of a CMA module 130 in wafer form and a number of controller dies 132 mounted to individual bonded die pairs.

Alternatively, once completed, the wafers 100, 200 with controller dies 132 may be diced (step 79) to form CLM semiconductor devices 134, each comprised of a controller die 132 affixed to a single pair of bonded dies 102, 202. Such an example is shown in FIG. 16. The CLM semiconductor device 134 in such an example may be diced from the wafers as by a laser or saw blade. It is understood that, for the example of FIG. 16, the bonded dies 102, 202 may be diced from wafers 100, 200 either before or after affixing the controller die 132.

Figure 19:
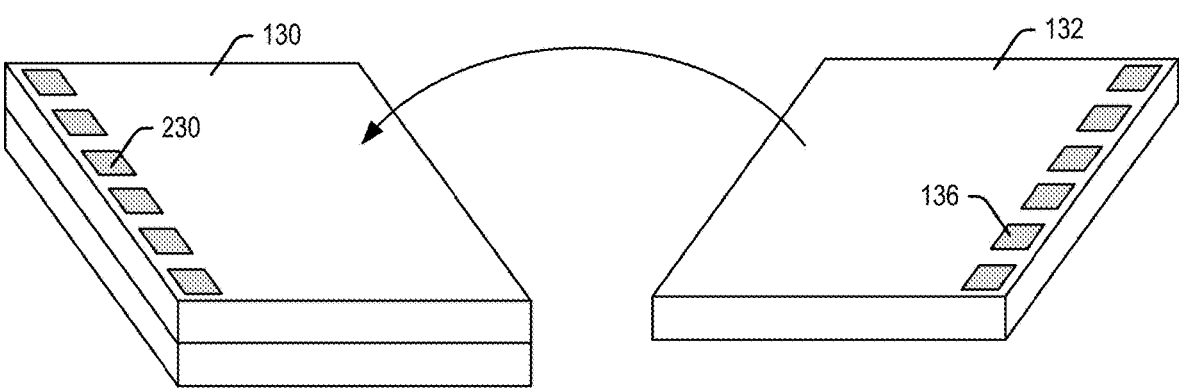
FIG. 19 is a perspective view of a controller die positioned to be bonded to a CMOS logic circuit and memory array module according to alternative embodiments of the present technology.
Figure 20:
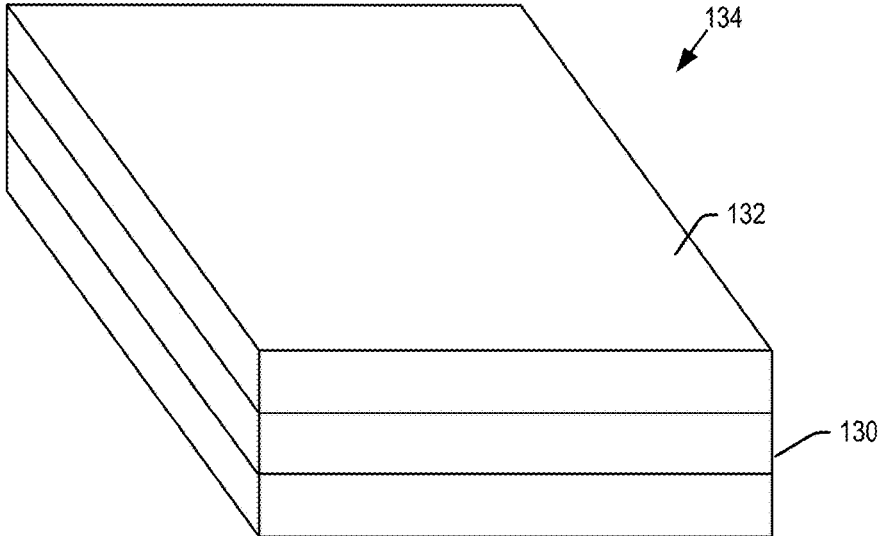
FIG. 20 is a perspective view of an integrated controller, logic circuit and memory array semiconductor device according to alternative embodiments of the present technology.
Figure 21:
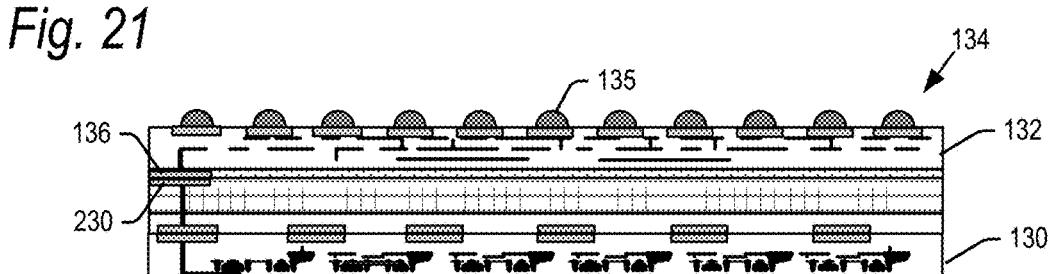
FIG. 21 is a cross-sectional view of an integrated controller, logic circuit and memory array semiconductor device according to alternative embodiments of the present technology.

A still further embodiment of the CLM semiconductor device 134 is shown in the perspective and cross-sectional views of FIGS. 19-21. In this embodiment, the controller dies 132 may have the same footprint as the bonded dies 102, 202 of the CMA module 130, and the controller die bond pads 136 may be the mirror image of the exterior die bond pads 230. With the CMA module 130 supported on a carrier (not shown), the controller die 132 may be flipped over from the position of FIG. 19 so that the controller die bond pads 136 and CMA module bond pads 230 lie against each other as shown in FIGS. 20 and 21. At this point, the joined controller die bond pads 136 and exterior die bond pads 230 may be physically and electrically coupled to each other, for example as by Cu-to-Cu bonding described above.

As seen for example in the perspective view of FIG. 20, embodiments of the CLM semiconductor device 134 may have a monolithic construction with all three semiconductor dies 102, 202 and 132 having the same footprint and being integrally attached to each other. FIG. 21 shows solder balls 135 affixed to a back surface of the controller die 132. As explained below with respect to FIG. 30, these solder balls 135 may be used to affix the CLM semiconductor device 134 to a host device, such as a printed circuit board.

In further embodiments, instead of individual semiconductor dies, the CLM semiconductor device 134 may be formed of a whole wafer 300 of controller dies 132 mounted to a CMA module 130 comprised of whole wafers 100, 200. In this embodiment, the controller dies 132 on wafer 300, and bond pads 136 on controller dies 132, would be mapped to the mirror image of the bonded die pairs and exterior bond pads 230 on the CMA module 130. The controller die wafer 300 may then be flipped over and bonded to the CMA module 130 with the semiconductor dies and die bond pads of all dies aligned with each other.

Figure 22:
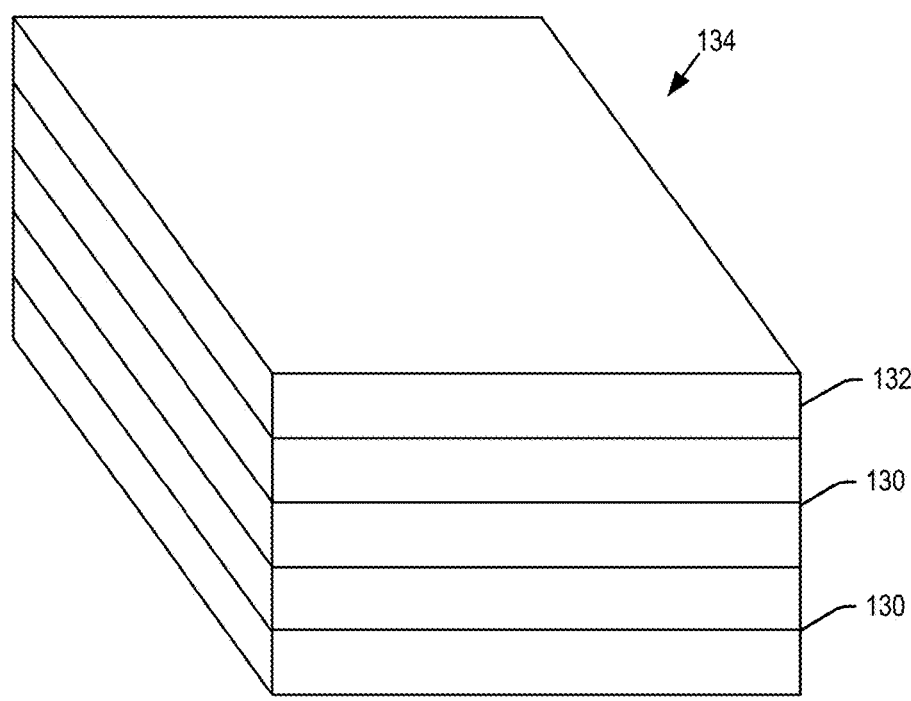
FIG. 22 is a perspective view of an integrated controller, logic circuit and memory array semiconductor device according to further alternative embodiments of the present technology.
Figure 23:
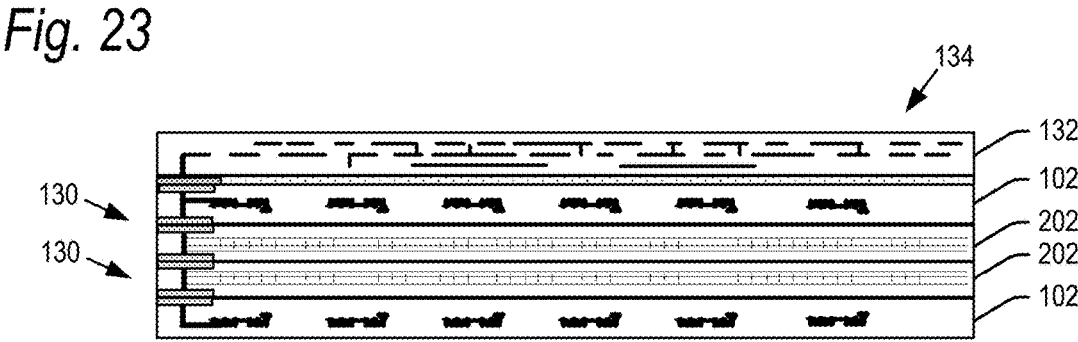
FIG. 23 is a cross-sectional view of the integrated controller, logic circuit and memory array semiconductor device of FIG. 21.

In embodiments described above, the CLM semiconductor device 134 includes a single CMA module 130 bonded to a controller die 132. It is understood that the composition of the CLM semiconductor device 134 may vary in further embodiments. For example, FIGS. 22 and 23 are perspective and cross-sectional views of a CLM semiconductor device 134 including a pair of CMA modules 130 bonded to the controller die 132. In the illustrated example, the CMA modules 130 have semiconductor dies arranged in the order of a CMOS logic circuit die 202 at the bottom, then a first memory array die 102, second memory array die 102, and a second CMOS logic circuit die 202 at the top. The controller die 132 is flipped over and the controller bond pads 136 bonded directly to the exterior bond pads 230 on the rear surface of the second CMOS logic circuit die 202. However, it is understood that the semiconductor dies of the CMA modules 130 may be arranged in any other order in further embodiments.

Figure 24:
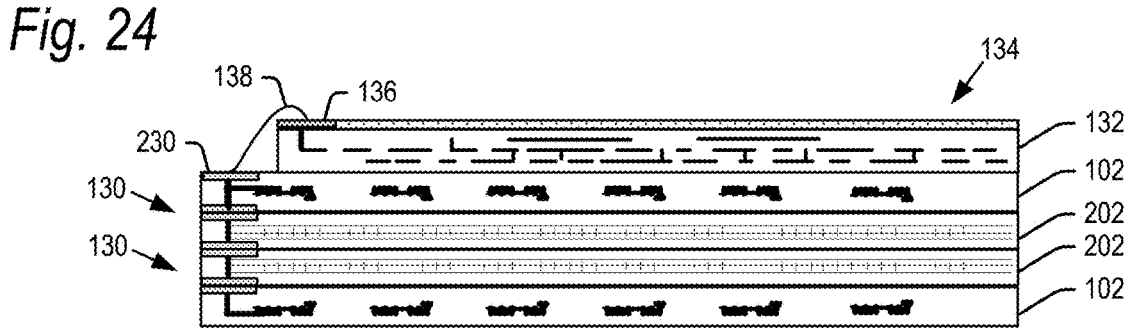
FIG. 24 is a cross-sectional view of an integrated controller, logic circuit and memory array semiconductor device according to alternative embodiments of the present technology.

FIG. 24 is a cross-sectional view of a CLM semiconductor device 134 similar to FIG. 23, but instead of a flipped controller die 132, the controller die 132 has a smaller width so that the bond pads 136 and 230 may be electrically coupled together with bond wires 138.

Figure 25:
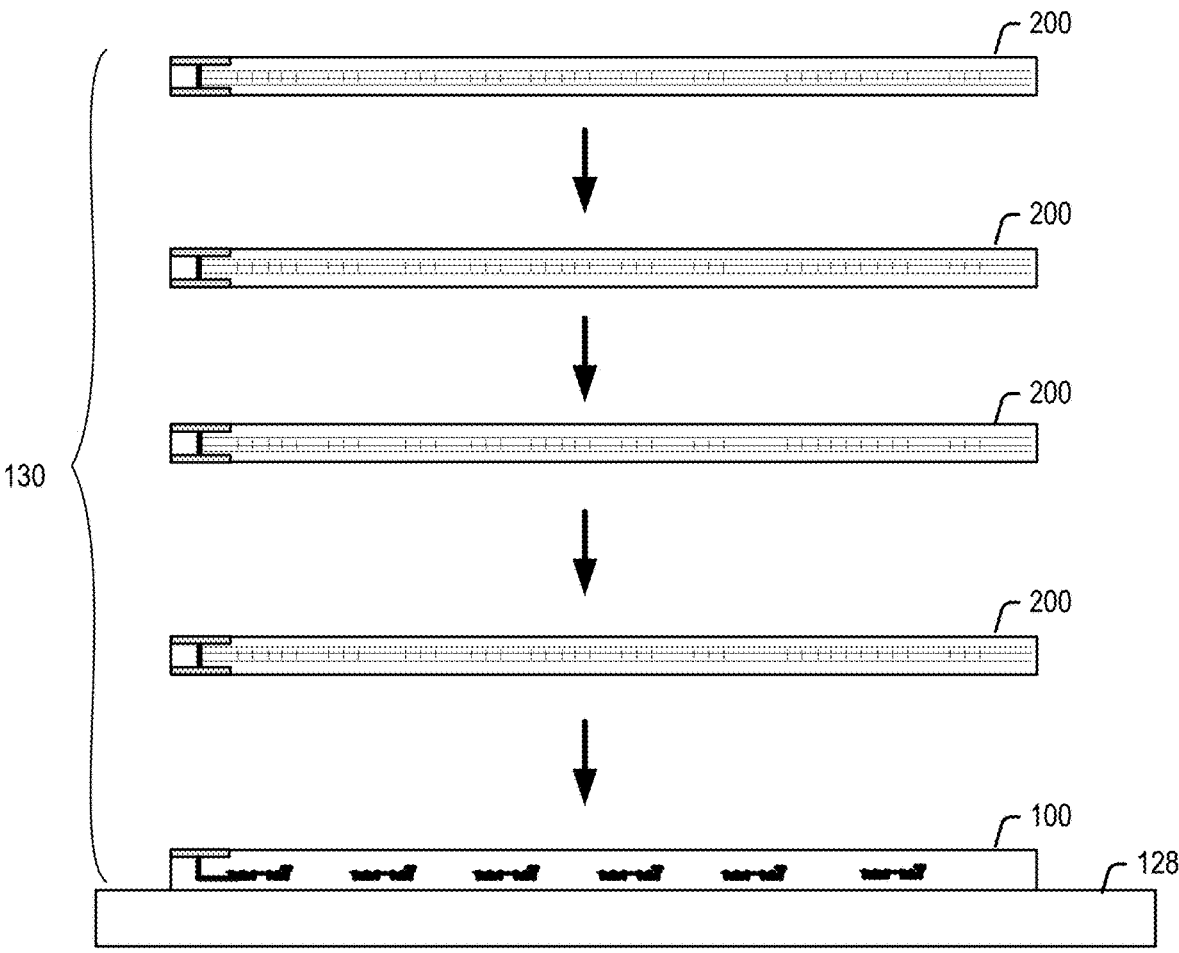
FIG. 25 is an exploded cross-sectional edge view of a plurality of stacked semiconductor dies from wafers forming a CMOS logic circuit and memory array module according to embodiments of the present technology.
Figure 26:
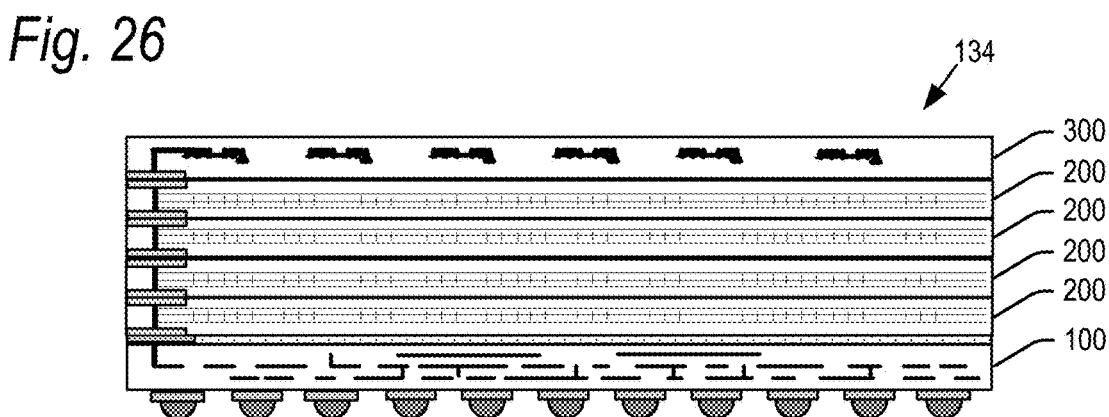
FIG. 26 is a cross-sectional view of an integrated controller, logic circuit and memory array semiconductor device using the CMOS logic circuit and memory array module of FIG. 25 according to embodiments of the present technology.

FIGS. 25 and 26 are cross-sectional views of a further embodiment of a CLM semiconductor device 134. In this embodiment, a CMOS logic circuit die or wafer may be affixed to a number of memory array dies or wafers to form a CMA module 130, which may further be bonded to a controller die 132. A CMOS logic circuit wafer 100 may initially be supported on a temporary carrier, such as temporary carrier 128. Thereafter, a first memory array wafer 200 may be mounted thereon and processed as described above with respect to FIGS. 10-12 (thinned and bond pads formed on the back surface). The memory array wafer 200 includes bond pads 220 and 230 coupled by full-thickness vias 216a.

Thereafter, additional memory array wafers 200 may be mounted on top of the first (bottommost) memory array wafer 200. Upon mounting each additional memory array wafer 200, the second major surface 208 may be thinned, and a group of exterior bond pads 230 may be formed in the thinned back surface 208 to allow for another memory wafer 200 or a controller wafer 300 as explained below. The memory array wafers 200 may be aligned and stacked on each other such that bond pads 220 of one wafer mount on top of the exterior bond pads 230 of the next lower wafer. The completed CMA module 130 shown in FIG. 25 includes a stack of four memory array wafers 200 mounted on a CMOS logic circuit wafer 100. It is understood that there may be fewer or greater memory array wafers 200 in the CMA module 130 shown in FIG. 25.

Referring now to the cross-sectional view of FIG. 26, after the desired number of memory array wafers 200 are bonded into the stack, a controller wafer 300 may be mounted on the uppermost memory array wafer 200 to form a completed CLM semiconductor device 134. The controller wafer 300 may be aligned and stacked on the uppermost memory array wafer 200 such that the controller bond pads 136 mount on top of the exterior bond pads 230 of the uppermost memory array wafer 200. As noted, various known bonding processes may be used to permanently bond the wafers 100, 200 and 300 to each other, such as for example Cu-to-Cu fusion bonding and hybrid bonding.

Figure 27:
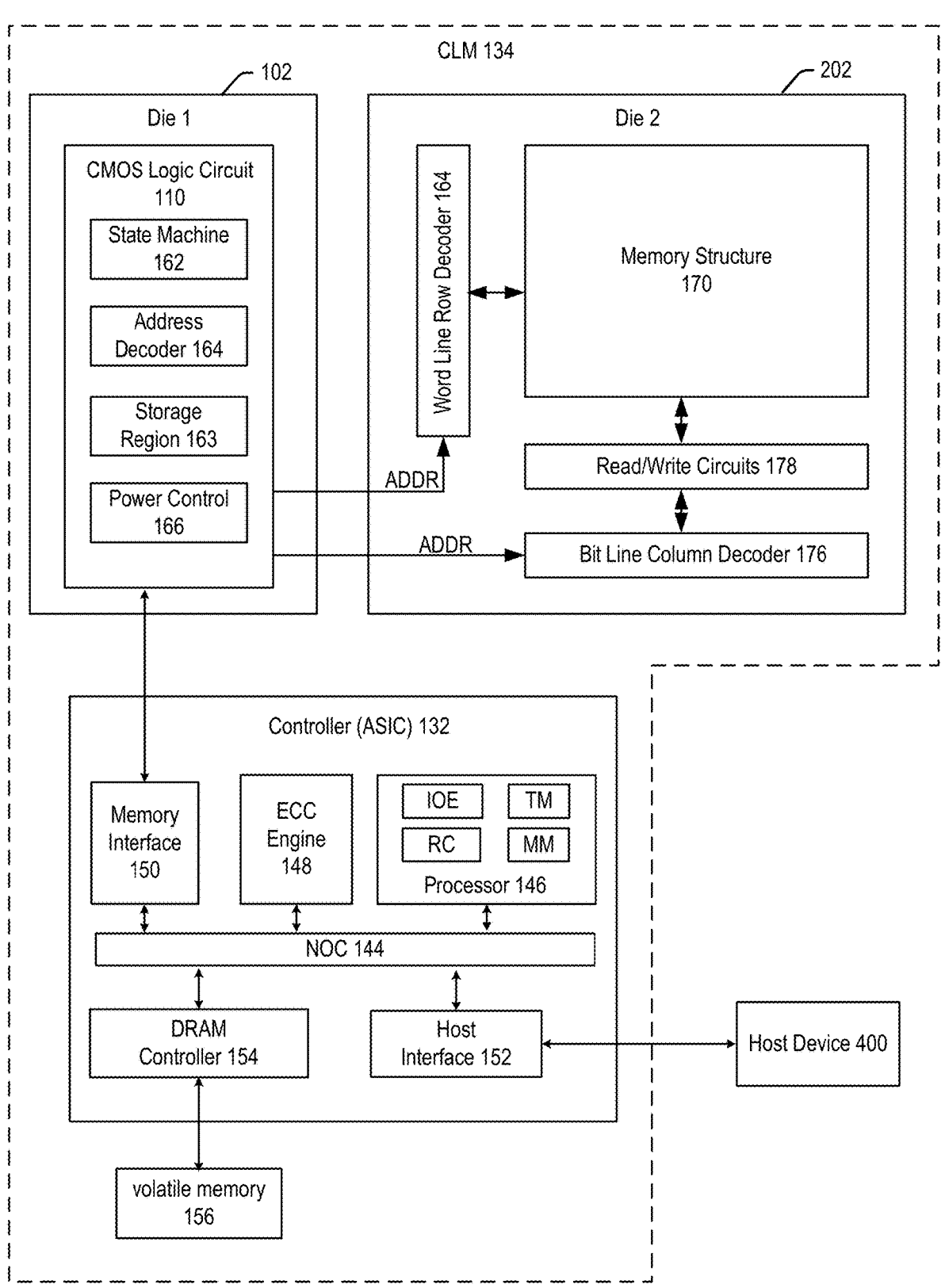
FIG. 27 is a schematic block diagram of an integrated controller, logic circuit and memory array semiconductor device according to embodiments of the present technology.

FIG. 27 is a schematic block diagram showing the functional components within the bonded controller die(s) 132, CMOS logic die(s) 102 and memory array die(s) 202 of a CLM semiconductor device 134. The controller die 132 comprises a host interface 152 that is connected to, and in communication with, a host device 400. In one embodiment, host interface 152 provides a PCIe interface. Other interfaces can also be used, such as SCSI, SATA, etc. Host interface 152 is also connected to a network-on-chip (NOC) 144. An NOC is a communication subsystem on an integrated circuit. NOCs can span synchronous and asynchronous clock domains or use unclocked asynchronous logic. The NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keeps growing, an NOC provides enhanced performance (such as throughput) and scalability in comparison with previous communication architectures (e.g., dedicated point-to-point signal wires, shared buses, or segmented buses with bridges). Connected to, and in communication with, NOC 144 are processor 146, ECC engine 148, memory interface 150, and DRAM controller 154. The DRAM controller 154 is used to operate and communicate with local high speed volatile memory 156 (e.g., DRAM). In other embodiments, local high speed volatile memory 156 can be SRAM or another type of volatile memory.

ECC engine 148 performs error correction services. For example, ECC engine 148 performs data encoding and decoding, as per the implemented ECC technique. In one embodiment, ECC engine 148 is an electrical circuit programmed by software. For example, ECC engine 148 can be a processor that can be programmed. In other embodiments, ECC engine 148 is a custom and dedicated hardware circuit without any software. In another embodiment, the function of ECC engine 148 is implemented by processor 146.

Processor 146 performs the various memory operations. For example, memory array module (MM) is a module/process running on processor 146 for performing programming, erasing, reading, as well as memory management processes. Read calibration manager (RC) is a module/process running on processor 146 for performing read calibration processes. In one embodiment, read calibration manager (RC) is implemented as part of ECC engine 148. Indication of error manager (IOE) is a module/process running on processor 146 for calculating an indication of error, which is used for the calibration of read reference levels. In one embodiment, indication of error manager (IOE) is implemented as part of ECC engine 148 or as part of read calibration manager (RC).

In one embodiment, processor 146 is programmed by firmware such that read calibration manager (RC) and indication of error manager (IOE) are firmware/software. In other embodiments, processor 146 is a custom and dedicated hardware circuit without any software. Processor 146 (alone or with ECC engine 148) can perform recalibration of read reference levels in order to determine updated read reference levels, including dynamically and adaptively choosing test read reference levels for sensing sample data.

Processor 146 also implements a translation module (TM), as a software/firmware process or as a dedicated hardware circuit. In many systems, the non-volatile memory is addressed internally to the storage system using physical addresses associated with the one or more memory die, discussed below. However, the host system will use logical addresses to address the various memory locations. This enables the host to assign data to consecutive logical addresses, while the storage system is free to store the data as it wishes among the locations of the one or more memory die.

Memory interface 150 communicates with the CMOS array logic circuit 110. The memory array 210 on the second die 202 (discussed below) may be controlled by memory array logic circuit 110 on the first die 102. The memory array logic circuit 110 may have circuitry used for accessing, controlling and driving memory elements of the memory array to accomplish functions such as programming and reading. The memory array logic circuit 110 cooperates with the read/write circuits 178 to perform memory operations on the memory array. The read/write circuits 178 may include multiple sense blocks (sensing circuitry) that allow a page of memory cells from memory array dies on the memory wafer (explained below) to be read or programmed in parallel.

In embodiments, logic circuit 110 may include a state machine 162, an address decoder 164, and a power control module 166. The state machine 162 provides chip-level control of memory operations. A storage region 163 may be provided for operating the memory array 210 such as programming parameters for different rows or other groups of memory cells. These programming parameters could include bit line voltages and verify voltages.

The address decoder 164 provides an address interface between that used by the host device or the controller die 132 to the hardware address used by the decoders 176 and read/write circuits 178. The power control module 166 controls the power and voltages supplied to the word lines and bit lines during memory operations. It can include drivers for word line layers in a 3D configuration, source side select gates, drain side select gates and source lines. A source side select gate is a gate transistor at a source-end of a NAND string, and a drain side select gate is a transistor at a drain-end of a NAND string.

It is understood that some of the above-described functionality of the controller dies 132 can be offloaded onto the memory array logic circuit dies 102, and vice-versa. It is further understood that some of the above-described functionality of the controller dies 132 and/or the memory array logic circuit dies 102 can be offloaded onto the memory array semiconductor dies 202. Additional components and functionality may be added to the CLM semiconductor device 134 in further embodiments.

Figure 28:
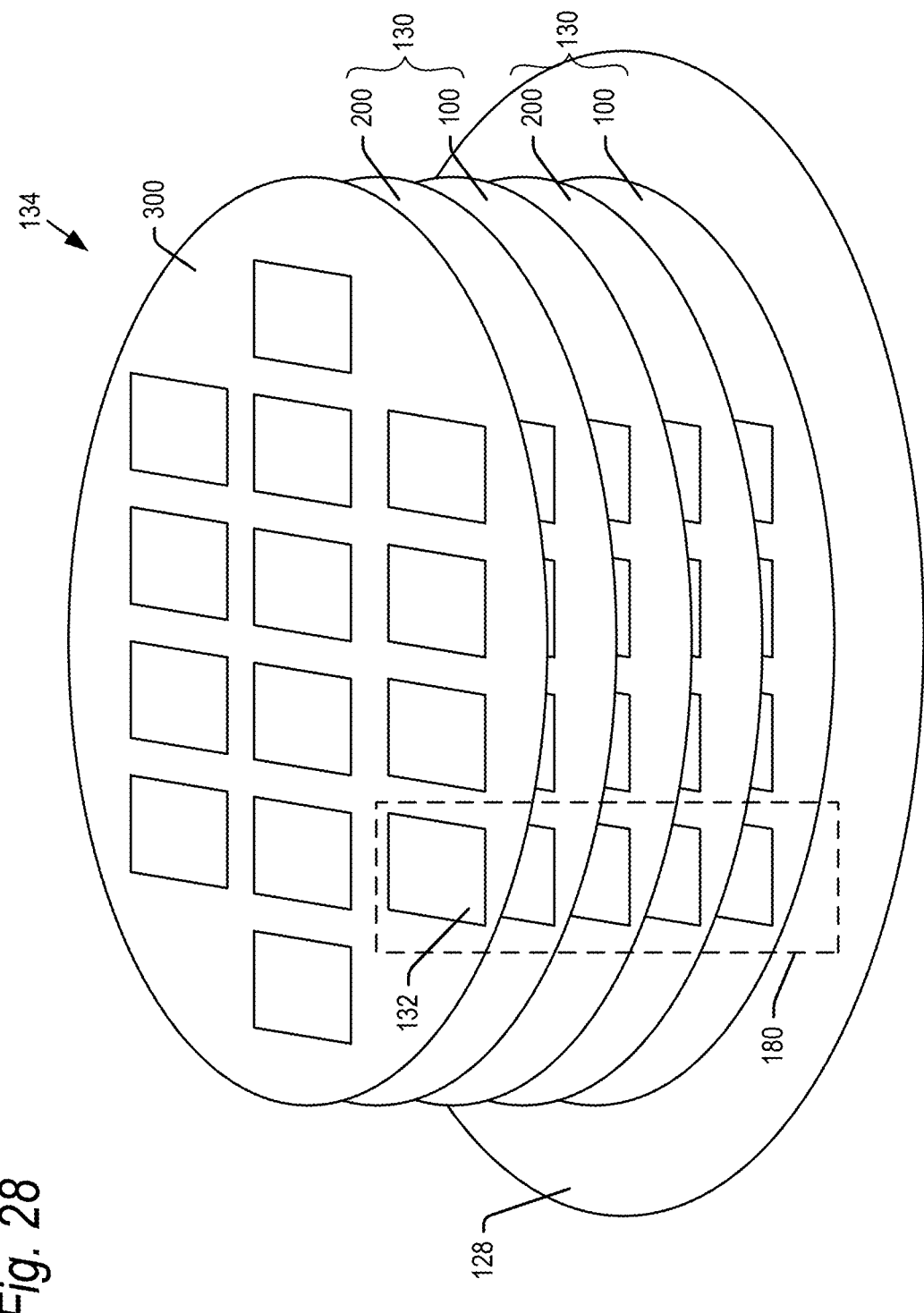
FIG. 28 is an exploded perspective view of wafers of an integrated controller, logic circuit and memory array semiconductor device including semiconductor dies with a one-plane configuration according to embodiments of the present technology.
Figure 29:
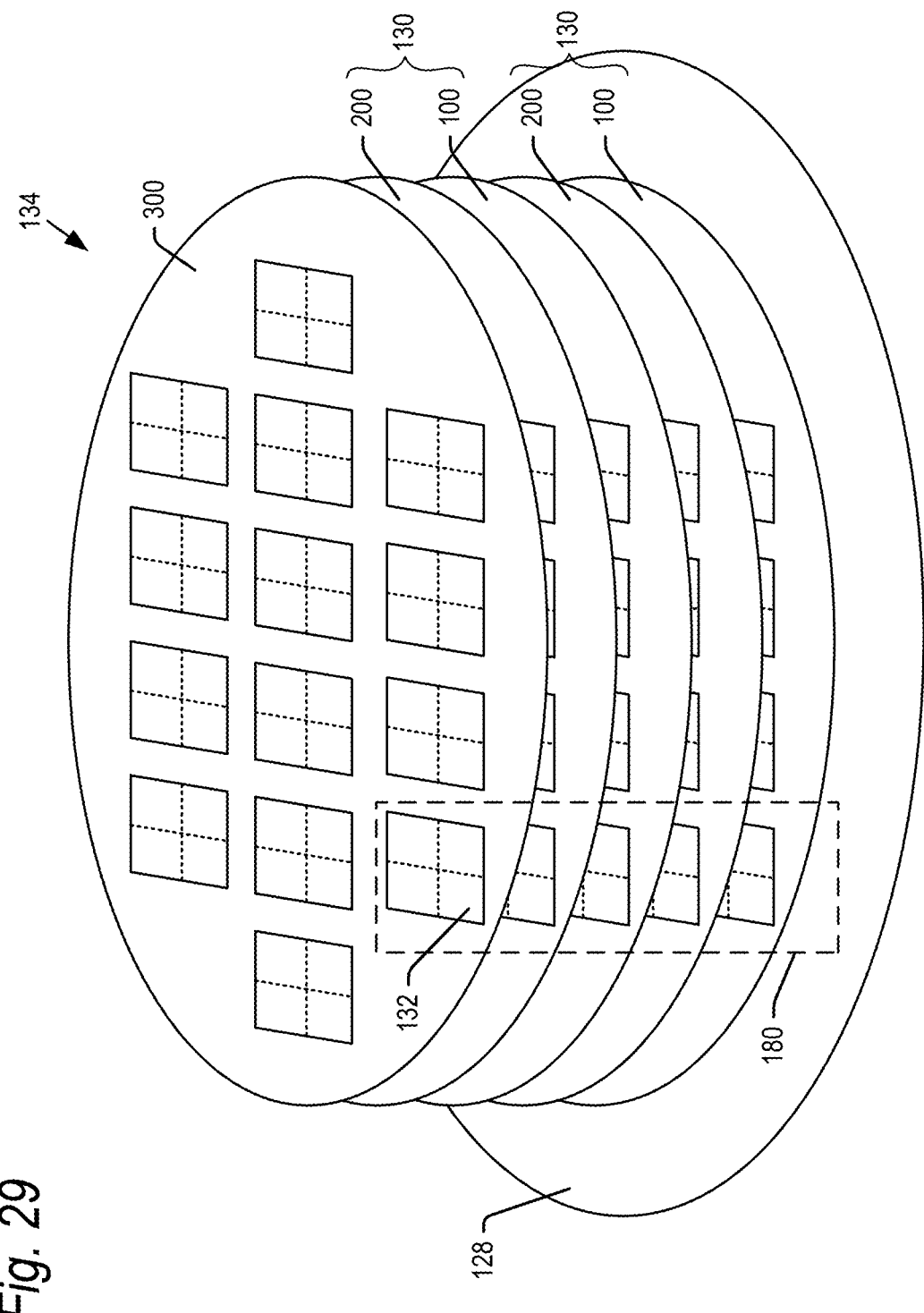
FIG. 29 is an exploded perspective view of wafers of an integrated controller, logic circuit and memory array semiconductor device including semiconductor dies with a four-plane configuration according to embodiments of the present technology.

FIG. 28 is an exploded perspective view of a group of semiconductor wafers 100, 200, 300 of a CLM semiconductor device 134 mounted on a temporary carrier 128. This example shows a pair of CMA modules 130, each comprised of a CMOS logic circuit wafer 100 and a memory array wafer 200. As indicated by the dashed box 180, the respective semiconductor dies of each wafer are aligned with each other to allow coupling of the die bond pads of the aligned semiconductor dies. The semiconductor dies in wafers 100, 200 and 300 shown in FIG. 28 are single plane semiconductor dies. FIG. 29 shows a similar configuration of a CLM semiconductor device 134, where the semiconductor dies in wafers 100, 200 and 300 are four plane semiconductor dies. As indicated, the four planes in each of the dies within the dashed box 180, as well as any die bond pads within the four planes, align with each other in the different wafers.

Figure 30:
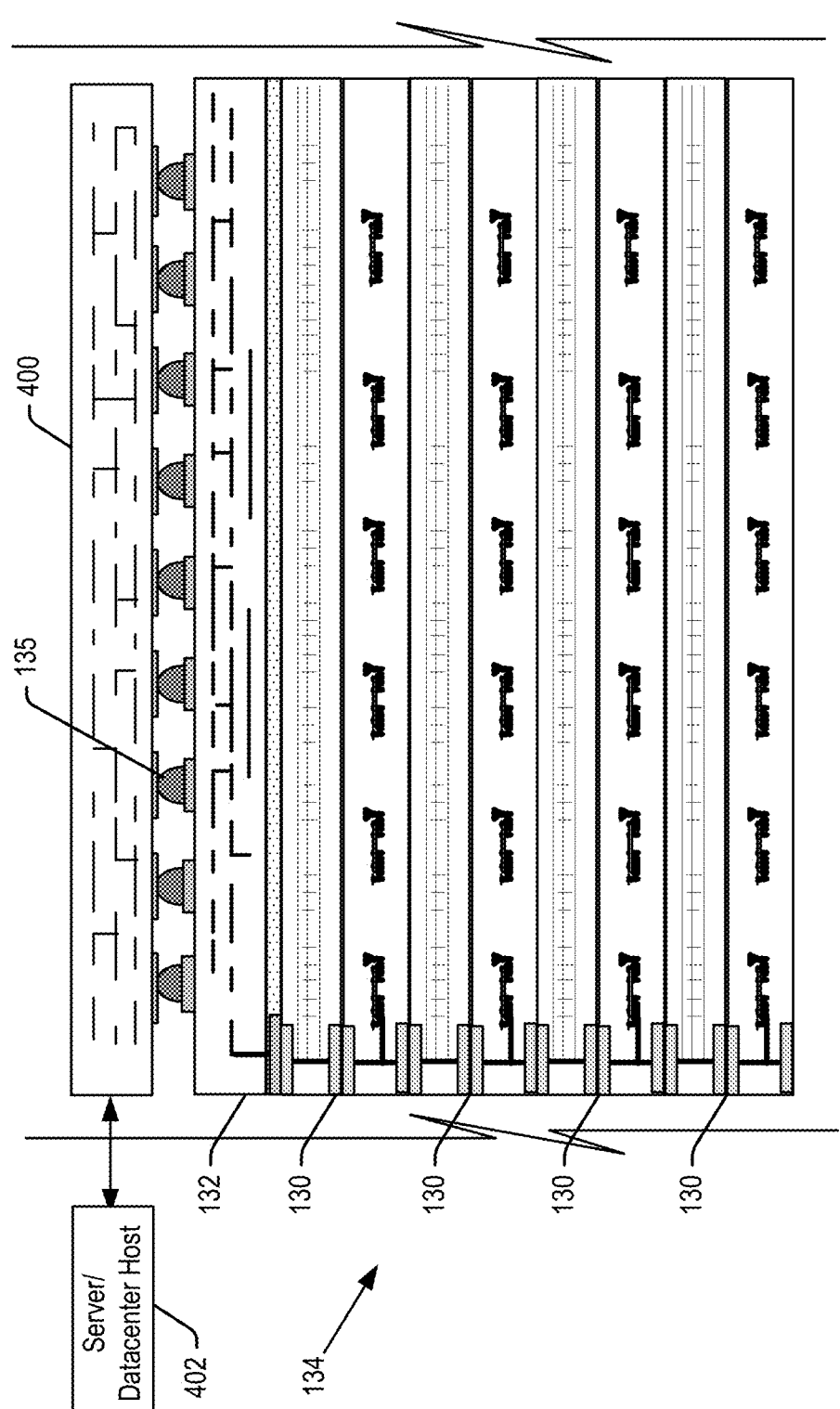
FIG. 30 is a cross-sectional view of an integrated controller, logic circuit and memory array semiconductor die used as an SSD device in an enterprise datacenter.

The CLM semiconductor device 134 shown in FIGS. 28 and 29 are comprised of whole wafers 100, 200 and 300. Such a device, also referred to herein as a CLM semiconductor wafer device, provides a high-capacity storage device, useful for example in datacenters or in other high-capacity applications. One such example is shown in FIG. 30. FIG. 30 shows a CLM semiconductor wafer device 134 comprised of a number of CMA modules 130 affixed to a controller wafer 300. The CLM semiconductor wafer device 134 is in turn affixed to a host device 400 via solder balls 135 on a back surface of the controller wafer 300. In this example, the host device 400 may be a printed circuit board enabling the exchange of data and signals between the CLM semiconductor wafer device 134 and a server/datacenter host 402.

In further embodiments, individual aligned semiconductor dies 102, 202, 132 in the respective wafers (such as within dashed box 180, FIG. 28) may be diced from the wafers to form a CLM semiconductor device 134 having a single column of semiconductor dies. Such a device may be referred to herein as a CLM semiconductor die device. A CLM semiconductor die device 134 may be mounted to a host device such as a printed circuit board and/or may be encapsulated for use as a memory card.

In embodiments described above, the controller wafer 300 is mounted on one or more CMA modules 130 after formation of the CMA modules. In further embodiments, the fabrication of the CLM semiconductor device may start with a controller wafer 300, to which one of a CMOS logic circuit semiconductor wafer 100 or a memory array wafer 200 may be bonded as described above. Thereafter, one or more additional CMOS logic circuit semiconductor wafers 100 or memory array wafer 200 may be added to the stack to form one or more CMA modules on the controller wafer 300.

Moreover, in the above description, the first semiconductor die/wafer has been described as the logic circuit die/wafer, the second semiconductor die/wafer has been described as the memory array die/wafer and the third semiconductor die/wafer has been described as the controller die/wafer. However, the first semiconductor die/wafer may comprise any of the logic circuit, the memory array and the controller die/wafer. The second semiconductor die/wafer may comprise any of the logic circuit, the memory array and the controller die/wafer. And the third semiconductor die/wafer may comprise any of the logic circuit, the memory array and the controller die/wafer.

As noted in the Background section, current high-capacity semiconductor devices suffer certain drawbacks, such as system performance, read/write latency and parasitic capacitance. These problems are solved by the CLM semiconductor device 134 of the present technology, in wafer and/or in die form. For example, conventional devices have controller chips and NAND dies as stand-alone chips which communicate with each other via printed circuit board connections such as wires and other metal resistive routings. In the present technology, the controller die and CMA NAND device are integrated together face to face with bond pads. Therefore, no such printed circuit board or metal routing connections are required.

As a result, parasitic resistances as well as parasitic capacitances associated with PCB metal connections/wires/routings from the controller chip to NAND dies are eliminated. Consequently, data communication speed from controller IOs (data-input/data-output) to the memory die IOs is significantly improved due to the absence of parasitic resistances and capacitances. Moreover, elimination of parasitic components associated with PCB wires and routing also improves data read latency/write performance.

In summary, an example of the present technology relates to a semiconductor device configured to operate with a host device, comprising: a logic circuit and memory array module comprising: one or more first semiconductor dies comprising a memory array logic circuit, and one or more second semiconductor dies directly affixed to the one or more first semiconductor dies, the one or more second semiconductor dies comprising a memory array, the memory array logic circuit of the one or more first semiconductor dies configured to interface with the memory array of the one or more second semiconductor dies; and one or more third semiconductor dies directly affixed to the logic circuit and memory array module, the one or more third semiconductor dies comprising one or more controller dies configured to interface with the host device.

In a further example, the present technology relates to a semiconductor device configured to operate with a host device, comprising: one or more first semiconductor dies comprising: first and second opposed surfaces, a first set of bond pads formed in the first surface; one or more second semiconductor dies comprising: third and fourth opposed surfaces, a second set of bond pads formed on the third surface, a third set of bond pads formed on the fourth surface, and vias extending between the second and third sets of bond pads through the one or more second semiconductor dies; one or more third semiconductor dies comprising: fifth and sixth opposed surfaces, a fourth set of bond pads formed on the fifth surface; wherein the first set of bond pads are directly affixed to the second set of bond pads, and the third set of bond pads are directly affixed to the fourth set of bond pads; and wherein the one or more first, second and third semiconductor dies together comprise one each of a memory array semiconductor die, a logic circuit semiconductor die configured to interface with the memory array semiconductor die, and a controller die configured to interface with the host device.

In another example, the present technology relates to a semiconductor device configured to operate with a host device, comprising: one or more first semiconductor dies comprising: first and second opposed surfaces, a first set of bond pads formed in the first surface; one or more second semiconductor dies comprising: third and fourth opposed surfaces, a second set of bond pads formed on the third surface, a third set of bond pads formed on the fourth surface, and vias extending between the second and third sets of bond pads through the one or more second semiconductor dies; one or more third semiconductor dies comprising: fifth and sixth opposed surfaces, a fourth set of bond pads formed on the fifth surface; wherein the first set of bond pads are directly affixed to the second set of bond pads, and the third set of bond pads are directly affixed to the fourth set of bond pads; and wherein the one or more first, second and third semiconductor dies together comprise one each of a memory means for storing data, logic circuit means for interfacing with the memory means, and controller means for interfacing with the host device.

The foregoing detailed description of the present technology has been presented for purposes of illustration and description. It is not intended to be exhaustive or to limit the invention to the precise form disclosed. Many modifications and variations are possible in light of the above teaching. The described embodiments were chosen in order to best explain the principles of the present technology and its practical application to thereby enable others skilled in the art to best utilize the present technology in various embodiments and with various modifications as are suited to the particular use contemplated. It is intended that the scope of the present technology be defined by the claims appended hereto.

We claim:

1. A semiconductor device configured to operate with a host device, comprising:

a logic circuit and memory array module comprising:

one or more first semiconductor dies comprising a memory array logic circuit, and one or more second semiconductor dies directly affixed to the one or more first semiconductor dies, the one or more second semiconductor dies comprising a memory array, the memory array logic circuit of the one or more first semiconductor dies configured to interface with the memory array of the one or more second semiconductor dies; and one or more third semiconductor dies directly affixed to the logic circuit and memory array module, the one or more third semiconductor dies comprising one or more controller dies configured to interface with the host device.

2. The semiconductor device of claim 1, wherein the one or more first semiconductor dies comprise a first whole wafer of semiconductor dies.

3. The semiconductor device of claim 2, wherein the one or more second semiconductor dies comprise a second whole wafer of semiconductor dies.

4. The semiconductor device of claim 3, wherein the one or more third semiconductor dies comprise a third whole wafer of semiconductor dies.

5. The semiconductor device of claim 3, wherein the one or more third semiconductor dies comprise a plurality of individual third semiconductor dies affixed to one of the first and second whole semiconductor wafers.

6. The semiconductor device of claim 5, wherein one of the first and second wafers comprises a first set of die bond pads.

7. The semiconductor device of claim 6, wherein the other of the first and second wafers comprises second and third sets of die bond pads connected to each other through a thickness of the other of the first and second wafers, and wherein the first set of die bond pads are directly affixed to the second set of die bond pads.

8. The semiconductor device of claim 7, wherein the plurality of individual third semiconductor dies comprise a fourth set of die bond pads directly affixed to the third set of die bond pads.

9. The semiconductor device of claim 1, wherein the one or more first semiconductor dies comprise just one first semiconductor die, and wherein the one or more second semiconductor dies comprise just one second semiconductor die.

10. The semiconductor device of claim 1, wherein the one or more first semiconductor dies comprise a plurality of wafers of first semiconductor dies.

11. The semiconductor device of claim 10, wherein the one or more second semiconductor dies comprise a plurality of wafers of second semiconductor dies stacked together with the wafers of first semiconductor dies.

12. The semiconductor device of claim 1, wherein the one or more first semiconductor dies comprise a single wafer of first semiconductor dies.

13. The semiconductor device of claim 12, wherein the one or more second semiconductor dies comprise a plurality of wafers of second semiconductor dies stacked on the single wafer of first semiconductor dies.

14. The semiconductor device of claim 1, further comprising bond wires for electrically coupling the one or more third semiconductor dies to the logic circuit and memory array module.

15. A semiconductor device configured to operate with a host device, comprising:

one or more first semiconductor dies comprising:

first and second opposed surfaces, a first set of bond pads formed in the first surface;

one or more second semiconductor dies comprising:

third and fourth opposed surfaces, a second set of bond pads formed on the third surface, a third set of bond pads formed on the fourth surface, and vias extending between the second and third sets of bond pads through the one or more second semiconductor dies; and one or more third semiconductor dies comprising a controller die configured to interface with the host device, the third semiconductor die comprising:

fifth and sixth opposed surfaces, a fourth set of bond pads formed on the fifth surface;

wherein the first set of bond pads are directly affixed to the second set of bond pads, and the third set of bond pads are directly affixed to the fourth set of bond pads; and wherein the one or more first and second semiconductor dies together comprise one each of a memory array semiconductor die and a logic circuit semiconductor die configured to interface with the memory array semiconductor die.

16. The semiconductor device of claim 15, wherein the one or more first semiconductor dies comprise one or more first semiconductor wafers of the one or more semiconductor dies.

17. The semiconductor device of claim 16, wherein the one or more second semiconductor dies comprise one or more first wafers of the one or more semiconductor dies stacked with the one or more first wafers.

18. The semiconductor device of claim 17, wherein the one or more third semiconductor dies comprise a third whole wafer of semiconductor dies, and wherein the third wafer of semiconductor dies comprise the controller dies.

19. The semiconductor device of claim 17, wherein the one or more third semiconductor dies comprise a plurality of individual third semiconductor dies affixed to one of the first and second whole semiconductor wafers, and wherein the third wafer of semiconductor dies comprise the controller dies.

20. A semiconductor device configured to operate with a host device, comprising:

one or more first semiconductor dies comprising:

first and second opposed surfaces, a first set of bond pads formed in the first surface;

one or more second semiconductor dies comprising:

third and fourth opposed surfaces, a second set of bond pads formed on the third surface, a third set of bond pads formed on the fourth surface, and vias extending between the second and third sets of bond pads through the one or more second semiconductor dies; and one or more third semiconductor dies comprising a controller die configured to interface with the host device, the third semiconductor die comprising:

fifth and sixth opposed surfaces, a fourth set of bond pads formed on the fifth surface;

wherein the first set of bond pads are directly affixed to the second set of bond pads, and the third set of bond pads are directly affixed to the fourth set of bond pads; and wherein the one or more first and second semiconductor dies together comprise one each of a memory means for storing data and logic circuit means for interfacing with the memory means.

* * * * *